United States Patent
Ottusch et al.

(10) Patent No.: US 6,847,925 B2
(45) Date of Patent: Jan. 25, 2005

(54) METHOD AND APPARATUS FOR MODELING THREE-DIMENSIONAL ELECTROMAGNETIC SCATTERING FROM ARBITRARILY SHAPED THREE-DIMENSIONAL OBJECTS

(75) Inventors: John Jacob Ottusch, Malibu, CA (US); Stephen M. Wandzura, Agora Hills, CA (US); Harry F. Contopanagos, Santa Monica, CA (US); John F. Visher, Maibu, CA (US); Vladimir Rokhlin, Santa Monica, CT (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/882,817

(22) Filed: Jun. 15, 2001

(65) Prior Publication Data

US 2003/0158715 A1 Aug. 21, 2003

Related U.S. Application Data

(60) Provisional application No. 60/213,102, filed on Jun. 21, 2000.

(51) Int. Cl.$^7$ .............................................. G06F 17/10
(52) U.S. Cl. ............................................ 703/2; 703/13
(58) Field of Search ........................................ 703/2, 13

(56) References Cited

U.S. PATENT DOCUMENTS 5,604,891 A * 2/1997 Burnett et al. ................. 703/2

OTHER PUBLICATIONS

Ottusch, J.J. et al., "Scalable electromagnetic scattering calculations on the SGI Origin 2000" Proc. of the ACM/IEEE SCC99 Conference on High Performance Networking and Computing, Proceedings of SC'99, Portland, OR, USA, Nov. 14–19, 1999, p. 12 XP002216590.

Michielssen E, et al., "Recent developments in fast–multipole based frequency and time domain solvers" MMET Conference Proc. 1998 Intern'l Conference on Mathematical Methods in Electromagnetic Theory. MMET 98 (Cat No. 98EX114), pp. 92–97, vol. 1, XP002216591.

Song, J.M. et al., "Multilevel fast–multipole algorithm for solving combined field integral equations of electromagnetic scattering" Microwave and Optical Technology Letters, Sep. 1995, USA, vol. 10, No. 1, pp. 14–19, XP008009276.

* cited by examiner

*Primary Examiner*—Russell Frejd
(74) *Attorney, Agent, or Firm*—Tope-McKay & Associates (57) ABSTRACT

A computer program product, an apparatus, and a method for modeling equivalent surface sources on a closed, arbitrarily shaped object that result from the imposition of an arbitrary time-harmonic incident field (e.g., a radar wave) are provided. An object divided into by a plurality of patches 302 and parameters for the incident field and the properties of the object 304 are provided to the system. Next, the system produces a discretized representation of a well-conditioned boundary integral equation in the form of a well-conditioned matrix equation, modeling the interaction between the incident field and the object 306. The well-conditioned linear system is solved numerically to determine equivalent surface sources on the object 308. The equivalent sources may then be used to determine electromagnetic fields resulting therefrom 310. The invention provides improved computational efficiency as well as increased modeling accuracy by effectively reducing the numerical precision necessary.

25 Claims, 3 Drawing Sheets

METHOD AND APPARATUS FOR MODELING THREE-DIMENSIONAL ELECTROMAGNETIC SCATTERING FROM ARBITRARILY SHAPED THREE-DIMENSIONAL OBJECTS

PRIORITY CLAIM

This application claims the benefit of priority to provisional application No. 60/213,102, filed in the United States on Jun. 21, 2000, and titled "Well-conditioned Boundary Integral Equations and Discretization for Three-Dimensional Electromagnetic Scattering".

STATEMENT OF GOVERNMENT RIGHTS

This invention was made with U.S. Government support from the Defense Advanced Research Projects Agency, under Contract No. MDA972-95-C-0021. The U.S. Government has certain rights in this invention.

FIELD OF THE INVENTION

The present invention relates generally to computer aided design and object modeling. More specifically, it relates to a computer program product, apparatus, and method for determining equivalent surface sources (or actual surface currents in the case of a metal object) on the surface of a closed, arbitrarily shaped object (e.g., a component of a vehicle such as an airplane part) that result from the imposition of an arbitrary time-harmonic incident field (e.g., a radar wave).

BACKGROUND

Software utilizing boundary integral equation techniques to solve electromagnetic scattering problems (e.g., using the method of moments) has existed at least since the 1960s. Such techniques have the potential for making very accurate radar cross-section predictions. However, practical application of the techniques to realistic problems is severely limited by poor scalability of computational resource requirements (i.e., CPU time and memory) relative to the problem size and complexity. With the relatively recent introduction of computational techniques involving high-order and "fast" mathematical methods (such as the fast multipole method (FMM)), the situation has changed drastically. Now, instead of the resource requirements for a problem described by N unknowns scaling in $O(N^3)$ time, they scale in $O(N \log N)$ time, much like the Fast Fourier Transform (FFT) algorithm. Consequently, it has become possible to handle a much wider array of problems of practical interest.

Although the methods used have improved drastically, fast methods must still be used in conjunction with iterative solvers. If the set of linear equations that arises from discretizing a boundary integral equation is ill conditioned, the number of iterations required to obtain an accurate solution is not well controlled, and may be very large. The overall efficiency of the solution process suffers accordingly. In addition, a high degree of numerical precision is generally required in the solution process, causing the need for rounding, and resulting in a loss of solution accuracy.

Unfortunately, the most widely used integral equation formulation for closed, perfect electrical conductors (PEC), namely, the combined field integral (CFIE) equation, is not, in general, well conditioned. The ill conditioning stems from the fact that the CFIE necessarily includes an integral operator component that is "hypersingular". This component is, in fact, not simply an integral operator at all, but rather the gradient of an integral operator. Whereas, ordinary integral operators tend to filter out the numerical "noise" associated with a discretization, differential operators tend to amplify it.

The eigenvalue spectrum of a hypersingular integral operator is unbounded, which leads directly to an ill-conditioned linear system. The ill effects become evident in the form of an increase in the required number of iterations as one refines the discretization of a target. Fine discretizations are often required to spatially resolve source variations or geometric detail on the subwavelength scale. This difficulty with the CFIE (as well as with some other boundary integral formulations in computational electromagnetics) is known as the "low frequency problem."

Various methods have been employed to overcome this problem. The most commonly practiced method is to multiply the CFIE matrix by a "preconditioner" matrix at every step of the iterative solver procedure. An effective preconditioner improves the condition number of a linear system, thereby reducing the number of iterations required for solution. Examples of preconditioners that have been utilized are the block-diagonal preconditioner, the incomplete LU preconditioner, and the sparse approximate inverse preconditioner. Preconditioners such as these are general purpose—in other words, they can be applied with varying degrees of success to any matrix. Unfortunately, however, none of them takes specific advantage of the analytical properties of the CFIE, so none of them is ideally suited for use with the CFIE.

Instead of preconditioning the equation, it is also possible to "post-condition" it. This involves defining the unknown part of the original linear equation to be the driving term for some new linear system. If the combined linear system is properly conditioned, then the problem is effectively solved because, once the new auxiliary unknowns have been solved for, it is straightforward to determine the solution to the original linear system. The moment method approaches that use "loop-star" basis functions fall into this category. While some success has been achieved with this technique, it is cumbersome with limited extensibility, and has been applied only to low-order, moment method discretizations.

Therefore, it is desirable to provide a preconditioner method that is specifically tailored for use with the CFIE. More specifically, the preconditioner should be designed to minimize the number of iterations required for a solution. This is especially desirable when the use of a fine discretization to resolve source variations or geometric detail on a subwavelength scale results in an ill-conditioned linear equation (the "low-frequency" problem). Most specifically, it is desirable to provide a computer program product, an apparatus, and a method for modeling the electromagnetic response of a closed arbitrarily shaped three-dimensional object to an arbitrary time-harmonic incident field by means of a well-conditioned boundary integral equation (BIE) by discretizing the well-conditioned BIE to provide and solve a well-conditioned finite dimensional linear system to determine the distribution of equivalent surface sources on the object.

References

[1] Leslie Greengard and Stephen Wandzura. Fast multipole methods. *IEEE Computational Science & Engineering*, 5(3):16–18, July 1998.

[2] John J. Ottusch, Mark A. Stalzer, John L. Visher, and Stephen M. Wandzura. Scalable electromagnetic scattering calculations for the SGI Origin 2000. In *Proceedings SC99*, Portland, Oreg., November 1999. IEEE.

[3] Jiming M. Song and Weng Cho Chew. The fast Illinois solver code: Requirements and scaling properties. *IEEE Computational Science & Engineering*, 5(3):19–23, July 1998.

[4] Andrew F. Peterson. The "interior resonance" problem associated with surface integral equations of electromagnetics: Numerical consequences and a survey of remedies. *Electromagnetics*. 10:293–312, 1990.

[5] George C. Hsiao and Ralph E. Kleinman. Mathematical foundations for error estimation in numerical solutions of integral equations in electromagnetics. *IEEE Transactions on Antennas and Propagation*, 45(3):316–328, March 1997.

[6] Nagayoshi Morita, Nobuaki Kumagai, and Joseph R. Mautz. *Integral Equation Methods for Electromagnetics*. Artech House, Boston, 1990.

[7] Robert J. Adams. *A Class of Robust and Efficient Iterative Methods for Wave Scattering Problems*. Ph.D. Thesis, Virginia Polytechnic Institute and State University, Blacksburg, Va., December 1998.

[8] Robert J. Adams and Gary S. Brown. Stabilization procedure for electric field integral equations. *Electronic Letters*, 35(23):2015–2016, November 1999.

[9] Peter Kolm and Vladimir Rokhlin. Quadruple and octuple layer potentials in two dimensions I: Analytical Apparatus. Technical Report YALEU/DCS/RR-1176, Yale University, Department of Computer Science, March 1999.

[10] Barrett O'Neil. *Elementary Differential Geometry*. Academic Press, New York, 1997.

[11] John David Jackson. *Classical Electrodynamics*. John Wiley & Sons, New York, second edition, 1975.

[12] Milton Abramowitz and Irene A. Stegun. *Handbook of Mathematical Functions*. Applied Mathematics Series. National Bureau of Standards, Cambridge, 1972.

[13] Lawrence S. Canino, John J Ottusch, Mark A. Stalzer, John L. Visher, and Stephen M. Wandzura. Numerical solution of the Helmholtz equation in 2d and 3d using a high-order Nyström discretization. *Journal of Computational Physics*, 146:627–663, 1998.

SUMMARY OF THE INVENTION

The present invention provides an improved method for modeling electromagnetic scattering from an arbitrarily shaped three-dimensional object to an arbitrary time-harmonic incident field. It allows for the determination of the scattering with an improved degree of numerical accuracy, while also providing for increased computational efficiency.

In a first embodiment, the present invention provides a computer program product, used in a computer system having a processor, for modeling an electromagnetic response of an arbitrarily shaped three-dimensional object to an arbitrary time-harmonic incident field by means of a well-conditioned boundary integral equation (BIE). The computer program product comprises recording medium; mans, recorded on the recording medium for producing a discretized representation of a well-conditioned BIE to provide a well-conditioned, finite-dimensional linear system whose solution approximates a distribution of equivalent surface sources on a model caused by the arbitrary time-harmonic incident field; and means, recorded on the recording medium, for solving the linear system to determine values of the equivalent surface sources; whereby solution of the well-conditioned finite-dimensional linear system provides improved computational efficiency and solution accuracy. Additionally, this embodiment of the present invention may comprise means, recorded on the recording medium for modeling electromagnetic scattering from the three-dimensional object due to the time-harmonic incident field as determined from the equivalent surface sources. Preferably, the computer program product is tailored for determining the electromagnetic scattering from a time-harmonic incident field in the form of a radar wavefront and where the three-dimensional object represents a component of a vehicle.

In another, more specific embodiment, the BIE produced by the computer program product is in the form of:

$$(E \text{ excitation term}) + \gamma(H \text{ excitation term}) = \{(E \text{ integral operator term}) + \gamma(H \text{ integral operation term})\}J$$

where, $\gamma$ is a complex constant and J represents the unknown surface source distribution.

In yet another, still more specific embodiment, the BIE produced by the computer program product is in the form of:

$$kT^S(ik)n \times E^{inc} + iZT^\alpha(ik)n \cdot H^{inc} = \{i[-T^\alpha(ik) \circ T^T(k) + T^\beta(ik) \circ T^L(k) - k^2 T^S(ik) \circ T^S(k)] - K^+(k)\}J$$

In a further embodiment, the present invention provides an apparatus for modeling the electromagnetic response of an arbitrarily shaped three-dimensional object to an arbitrary time-harmonic incident field by means of a well-conditioned boundary integral equation (BIE). The apparatus comprises a computer system having a processor, a memory connected with the processor, and an input/output device connected with the processor for receiving parameters representing an arbitrarily shaped three-dimensional object and an arbitrary time-harmonic incident field; means, operating in the processor and the memory of the computer for utilizing the parameters representing the arbitrarily shaped three-dimensional object and the arbitrary time-harmonic incident field for producing a discretized representation of a well-conditioned BIE to provide a well-conditioned finite dimensional linear system whose solution approximates a distribution of equivalent surface sources on a model caused by the time-harmonic incident field; and means, operating in the processor and the memory of the computer for solving the linear system to determine values of the equivalent surface sources; whereby solution of the well-conditioned finite dimensional linear system provides improved computational efficiency and solution accuracy. Similar to the computer program product embodiments, the apparatus further comprises means, operating in the processor and the memory of the computer for modeling electromagnetic scattering from the three-dimensional object due to the time-harmonic incident field as determined from the equivalent surface sources. Again, the apparatus is preferably tailored for determining the electromagnetic scattering from a time-harmonic incident field represented in the form of a radar wavefront and where the three-dimensional object represents a component of a vehicle.

In another, more specific embodiment, the BIE produced by the apparatus is in the form of:

$$(E \text{ excitation term}) + \gamma(H \text{ excitation term}) = \{(E \text{ integral operator term}) + \gamma(H \text{ integral operation term})\}J$$

where, $\gamma$ is a complex constant and J represents the unknown surface source distribution.

In yet another, still more specific embodiment, the BIE produced by the apparatus product is in the form of:

$$kT^S(ik)n \times E^{inc} + iZT^\alpha(ik)n \cdot H^{inc} = \{i[-T^\alpha(ik) \circ T^T(k) + T^\beta(ik) \circ T^L(k) - k^2 T^S(ik) \circ T^S(k)] - K^+(k)\}J$$

The present invention further provides a method for modeling an electromagnetic response of an arbitrarily shaped three-dimensional object to an arbitrary time-harmonic incident field by means of a well-conditioned boundary integral equation (BIE). The method operates on a computer system having a processor, a memory connected with the processor, and an input/output device connected with the processor for receiving parameters representing an arbitrarily shaped three-dimensional object and an arbitrary time-harmonic incident field. The method comprises the steps of: utilizing the parameters representing the arbitrarily shaped three-dimensional object and the arbitrary time-harmonic incident field for producing a discretized representation of a well-conditioned BIE to provide a well-conditioned finite dimensional linear system whose solution approximates a distribution of equivalent surface sources on a model caused by the arbitrary time-harmonic incident field; and solving the linear system to determine values of the equivalent surface sources; whereby solution of the well-conditioned finite-dimensional linear system provides improved computational efficiency and solution accuracy.

Additionally, the method can further comprise the step of modeling electromagnetic scattering from the three-dimensional object due to the time-harmonic incident field as determined from the equivalent surface sources. The method is preferably operated where the time-harmonic incident field is a radar wavefront and wherein the three-dimensional object represents a component of a vehicle, in order to determine the scattering of radar waves from a vehicle component due to in incident radar wave.

In another, more specific embodiment, the BIE produced by the method is in the form of:

$$(E \text{ excitation term}) + \gamma(H \text{ excitation term}) = \{(E \text{ integral operator term}) + \gamma(H \text{ integral operation term})\}J$$

where, $\gamma$ is a complex constant and J represents the unknown surface source distribution.

In yet another, still more specific embodiment, the BIE produced by the method is in the form of:

$$kT^S(ik)n \times E^{inc} + iZT^\alpha(ik)n \cdot H^{inc} = \{i[-T^\alpha(ik) \circ T(k) + T^\beta(ik) \circ T^L(k) - k^2 T^S(ik) \circ T^S(k)] - K^+(k)\}J$$

DETAILED DESCRIPTION

The present invention provides a computer program product, a method, and an apparatus for generating and solving well-conditioned boundary integral equations for modeling three dimensional electromagnetic scattering of an incident wavefront from an object. It should be understood that this description is not intended to limit the invention. On the contrary, the invention is intended to cover alternatives, modifications and equivalents, which are included in the spirit and scope of the invention as defined by the appended claims. Furthermore, in the following detailed description of the present invention numerous specific details are set forth in order to provide a thorough understanding of the present invention. However, it will be obvious to one of ordinary skill in the art that the present invention may be practiced without the specific details.

Introduction

In the presence of an incident wavefront, the surface properties of an object affect scattering of the wave from the object's surface. By properly modeling the object and the incoming wavefront, it is possible to determine how waves will be scattered from the object's surface. Determination of this scattering is of particular importance with regard to designing objects having reduced radar cross-sections as well as in designing antennae or other objects that are configured to maximize electromagnetic interception.

The present invention, in a general sense, provides a computer program product, a method, and an apparatus for receiving a computer model of an object comprised of a mesh of a plurality of patches; for specifying an incident wavefront having an excitation wavelength, wavefront geometry (e.g., plane wave, etc.), and incident angle; and, based on the properties of the object and the wavefront, determining the equivalent surface sources resulting from the interaction of the wavefront with the object, and from the equivalent surface sources, modeling the scattering of energy from the surface of the object.

Invention Overview

The following overview is presented with reference to the figures in order to provide a high-level conceptual understanding of the present invention prior to discussing the mathematical details and specific advantages inherent therein. First, an overview of the data processing system of the present invention is provided, followed by a brief illustration and flow diagram explaining the operation of the present invention. Subsequent to the overview, further details of the present invention will be provided, followed by a set of numerical results demonstrating the advantages of the modified CFIE of the present invention over the conventional CFIE. Finally, an appendix and glossary are provided to give the reader a convenient source for understanding some of the terms and conventions utilized herein.

Data Processing System

The present invention is designed to be operated on a data processing system, which may comprise a general or special purpose computer. Having reference now to the drawings, in FIG. 1, there is shown a computer or data processing system generally designated by reference character 100. The computer 100 generally includes a central processing unit (CPU) 102 which is coupled with a memory 104. The memory 104 generally comprises both random access memory (RAM) and read-only memory (ROM) portions. The computer 100 further comprises at least one input/output device 106 connected with the CPU 102, such as a keyboard, a pointing device, a scanning device, or other available and useful devices. A display 108 is also connected with the CPU 102 to provide output to a user. Further, a storage mechanism 110 is provided to enable a user to store and retrieve data. Non-limiting examples of various storage mechanisms 110 that may be of use with the present invention include hard drives, optical drives (such as a compact disc or digital versatile disc), and magnetic drives (such as floppy disks, magnetic tapes, and Zip™ disks). Finally, a communications adapter 112 (such as a modem or network interface card) may also coupled with the computer 100 in order to allow communication with other computers 100. Note further that the data processing system may also comprise a network of computers either local to or remote from each other. In addition, the various components of the data processing system may all be local or may be distributed remotely from each other.

Figure 1:
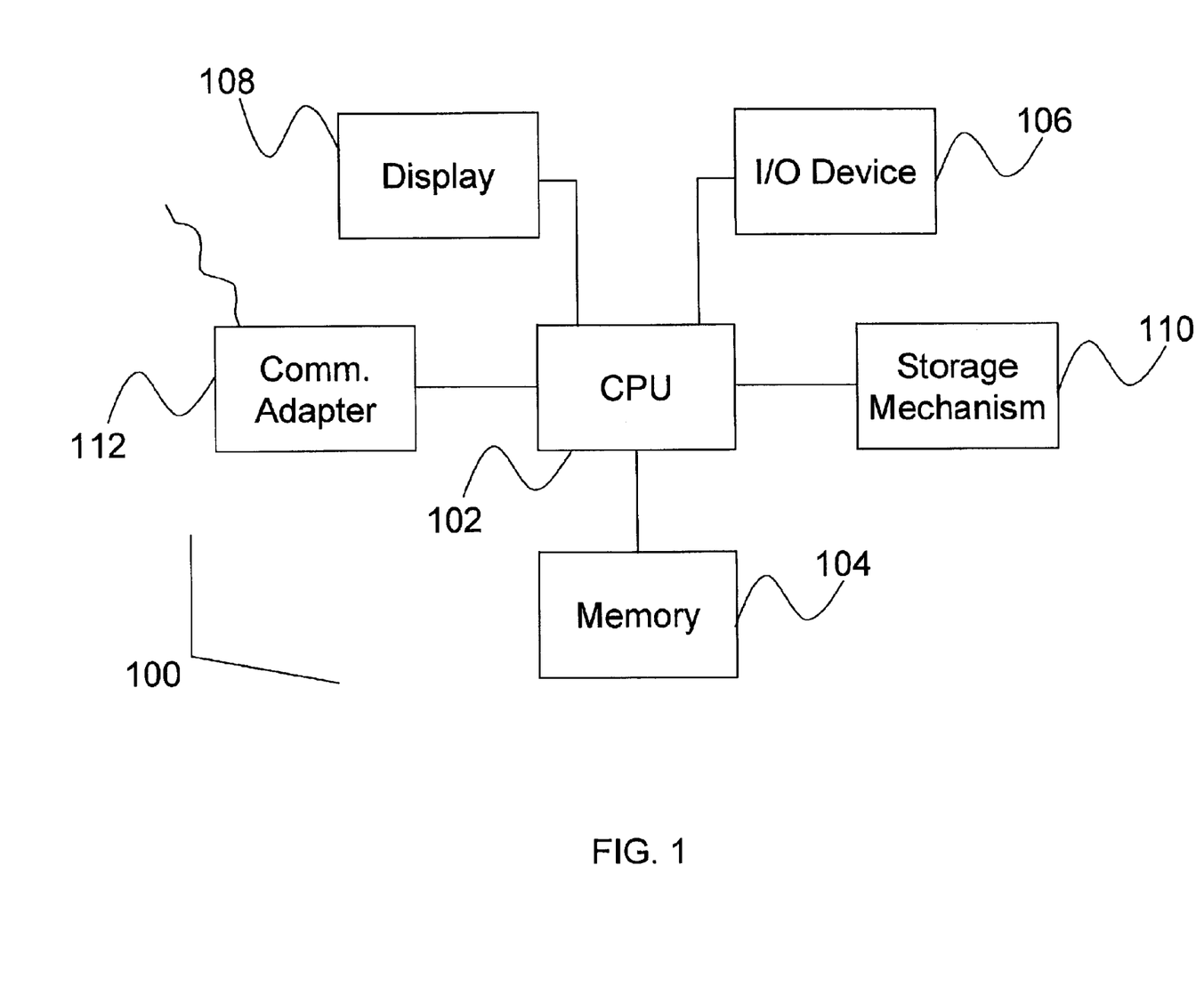
FIG. 1 is a block diagram representing a general purpose computer system used in conjunction with the present invention.

Although described at a major-component level, it is assumed that the computer 100 includes all of the necessary adapters to drive all of the peripherals necessary for use with the present invention. Additionally, various commercially available processors could be used in conjunction with the present invention, and could be programmed to operate the logic of the preferred embodiments.

Figure 2:
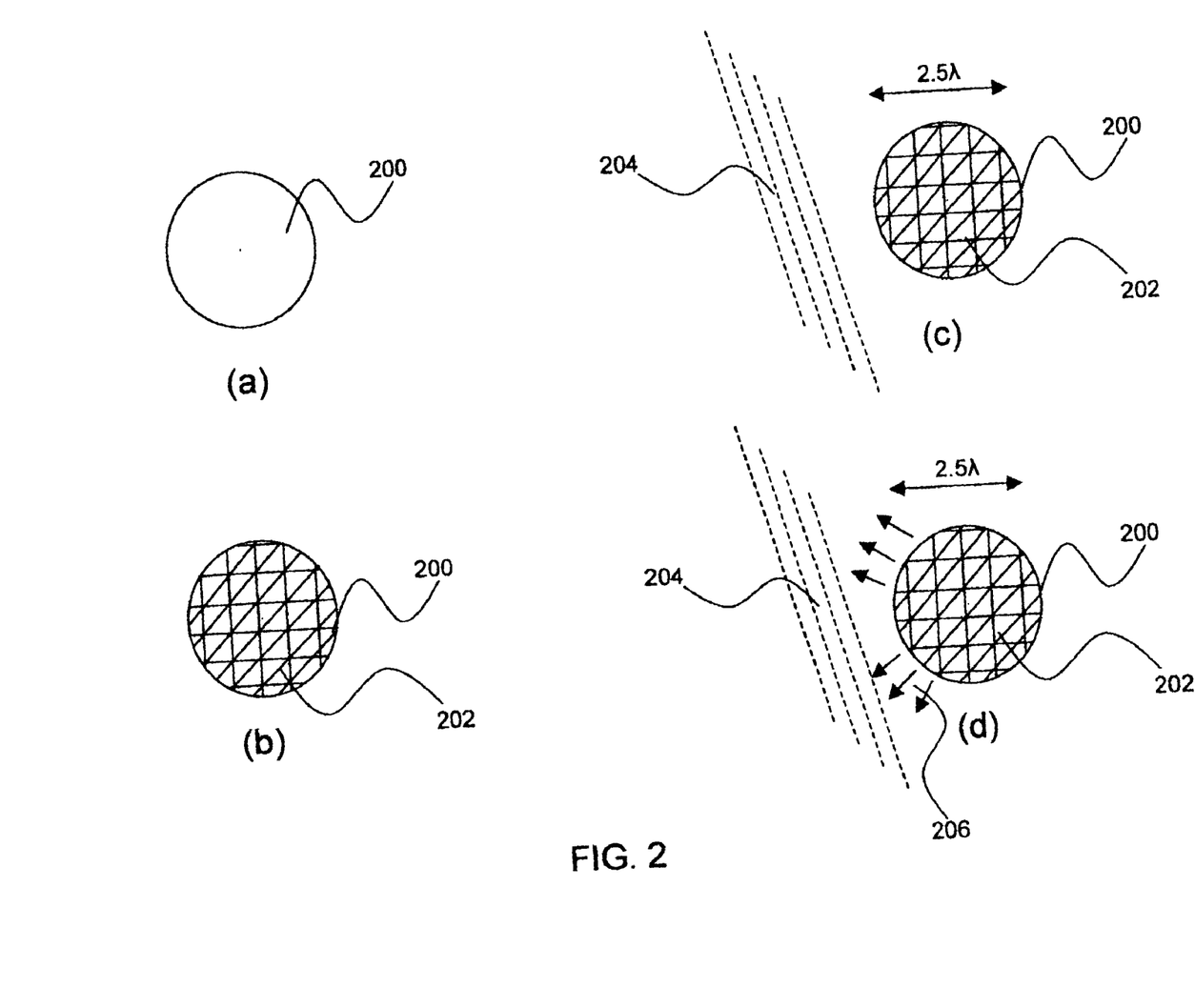
FIG. 2(a) is an illustrative diagram showing an object having a diameter of 2.5$\lambda$ (where $\lambda$ represents a wavelength), and corresponding to element 300 of FIG. 3.
FIG. 2(b) is an illustrative diagram showing the object of FIG. 2(a) modeled as a plurality of triangular patches, and corresponding to element 302 of FIG. 3.
FIG. 2(c) is an illustrative diagram showing the object of FIG. 2(b) with an incident field, and corresponding to element 304 of FIG. 3.
FIG. 2(d) is an illustrative diagram showing the object of FIG. 2(c) with an incident field and with electromagnetic fields resulting from equivalent surface sources due to the incident field, and corresponding to elements 306, 308, and 310 of FIG. 3.
Figure 3:
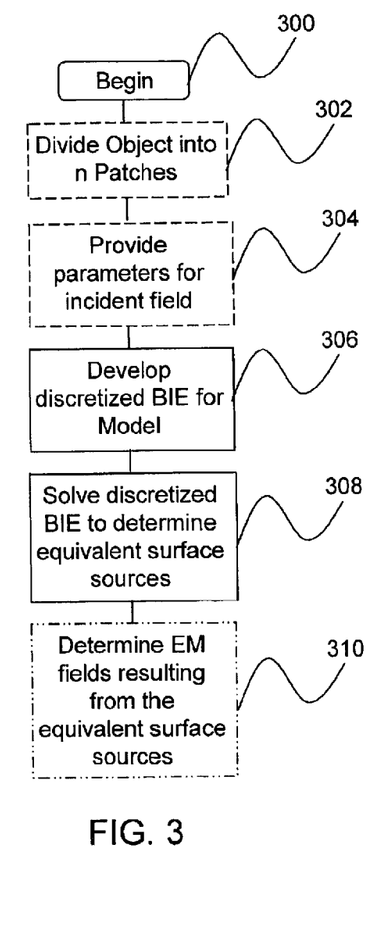
FIG. 3 is a flow diagram demonstrating the method of the present invention in conjunction with the steps of inputting object and incident field parameters, dividing the model of the object into a plurality of patches, and the optional step of determining electromagnetic fields.

Illustration and Flow Diagram of the Operation of the Present Invention Referring to FIG. 2, and FIG. 3, the operation of the present invention is described by means of an illustrative description and a flowchart. After starting operation of the present invention, represented by the begin 300 element in FIG. 3, an object 200 is divided into a plurality of patches, represented by element 202 in FIG. 2 and element 302 in FIG. 3. Note that methods for dividing the object into a plurality of patches are well-known in the literature, and that the patches may be of an arbitrary geometric shape (e.g., triangles, squares, etc.). Next, parameters are supplied for the incident field and the properties of the object as depicted by element 304 of FIG. 3. The incident field is depicted as element 204 in FIG. 2. The dashed lines surrounding elements 302 and 304 of FIG. 3 are intended to indicate that they are environmental to the present invention, as the patches 202 representing the object 200 and the parameters for the incident field 204 and the object 200 may simply be passed as inputs to a system incorporating the present invention. Optionally, however, the present invention may include a system for dividing the object 200 into a plurality of patches 202 and for more directly determining the associated parameters. In addition, although the object 200 is represented as a sphere and the incident field 204 is represented as a series of planar waves, these specifics are provided for illustrative convenience only. The object 200 may be any closed arbitrary shape and the incident field 204 may be any arbitrary time-harmonic field. Next, as shown by element 306 in FIG. 3, the system develops a discretized representation of a well-conditioned boundary integral equation (which takes the form of a well-conditioned matrix equation), modeling the interaction between the incident field 204 and the object 200. The well-conditioned linear system is then solved numerically to determine equivalent surface sources on the object, as depicted by element 308 in FIG. 3. After solving for the equivalent sources, the present invention may utilize the equivalent sources in order to determine electromagnetic fields resulting therefrom, as depicted by element 310 of FIG. 3. The dash-dot-dot line in element 310 is intended to indicate that it is optional. The electromagnetic scattering from the object is represented by element 206 in FIG. 2.

By providing a well-conditioned linear system in the determination of the equivalent sources, the present invention helps to ensure that the solution to the linear system can be performed with fewer iterations and with increased numerical precision relative to conventional methods. In fact, without the use of the well-conditioned linear system, it is sometimes impractical to determine the equivalent surface sources accurately due to the limited numerical precision of one's computer.

Recording Medium

Figure 4:
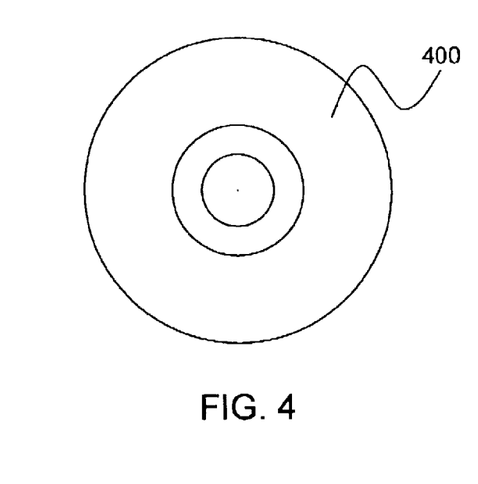
FIG. 4 is an illustrative diagram of a computer program product according to the present invention, stored on CD or DVD.

In one embodiment, the present invention takes the form of a computer program product recorded on a recording medium. A disc, shown in FIG. 4 represents a recording medium 400 such as a compact disc (CD) or a digital versatile disc (DVD). Although depicted as a CD or DVD, any recording medium could be utilized, examples of which include magnetic discs and tapes, and other optical storage medium.

Further Details of the Present Invention

Well-Conditioned CFIE Formulation

In accordance with features of the present invention, to provide improved computational efficiency and accuracy, modifications are made to the combined field integral equation (CFIE) for the solution of electromagnetic scattering problems in three dimensions. Unlike the conventional CFIE, the modified CFIE of the present invention is well-conditioned. It combines, a standard magnetic field integral operator with a pre-conditioned electric field integral operator, with the resulting modified CFIE being an integral equation of the second-kind that has no spurious resonances. As a result of the pre-conditioning, the number of iterations required to solve the CFIE stabilizes even as discretization of the surface is refined, whereas refinement of the discretization in conjunction with the conventional CFIE results in an ill-conditioned linear system and a growing number of iterations. The conventional CFIE, not being well-conditioned, suffers from two major drawbacks.

As mentioned previously, there are three principal reasons why well-conditioned boundary integral formulations are beneficial. The first is the fact that sparse decompositions of the integral operators of scattering theory, but not their inverses, exist, so iterative solvers must be employed. Well-conditioned systems of equations can be solved with few iterations. Second, using a fine discretization to resolve source variations or geometric detail on a sub-wavelength scale typically results in an ill-conditioned linear equation as well (also known as the "low-frequency" problem in computational electromagnetics). Third, because the process of generating a solution to the set of discretized equations can require a very wide range of values (in terms of magnitude), the resulting solutions may be quite inaccurate because a high degree of numerical precision may be required, which may exceed the accuracy permitted by the data processing system.

Only second-kind integral equations, or objects with similar spectral behavior (such as appropriately preconditioned differential equations) can be solved with fully controlled approximation error. The correct operators are the sum of a constant (or at least well-conditioned and easily invertible) operator and a compact operator.

Boundary integral operators of scattering typically violate this requirement in one of three ways: the spectrum may accumulate at zero; the operator may have an unbounded spectrum; or the operator may have small eigenvalues associated with resonances, often unphysical (e.g., "spurious resonances").

For electromagnetic scattering from perfectly conducting (PEC) surfaces, the standard boundary integral equations are the electric field integral equation (EFIE)

$$-n \times E^{inc} = TJ \text{ (where inc stands for incident),} \quad (1)$$

and the magnetic field integral equation (MFIE)

$$Zn \times H^{inc} = \left(\frac{1}{2} + K\right)J, \quad (2)$$

where the integral operators T and K are defined by $$TJ \equiv T(k)J \quad (3)$$
$$\equiv ikn(x) \times \int_s ds'$$
$$\left\{G(k; x, x')J(x) + \frac{1}{k^2}\nabla[\nabla G(k; x, x') \cdot J(x')]\right\} \text{ and}$$

$$KJ \equiv K(k)J \equiv -n(x) \times \int_s ds' \nabla G(k; x, x') \times J(x'), \quad (4)$$

where $\nabla$ denotes differentiation with respect to x, and n(x) is the unit normal to the surface at x. Note that the other terms follow the usual conventions: J≡Zn×H is the unknown surface current, $E^{inc}$ and $H^{inc}$ are the incident electric and magnetic fields, respectively, $Z=\sqrt{\mu/\epsilon}$ is the wave impedance, and G(k; x, x')=exp(ikr)/4πr is the 3d Helmholtz kernel with r=|x-x'| being the distance separating field and source points. Harmonic time dependence $e^{-i\omega t}$ is assumed.

The MFIE is a second-kind integral equation. Unfortunately, this equation is suitable for an unacceptably small class of electromagnetic problems. It is inapplicable to open surfaces, becomes ill-conditioned in the presence of geometric singularities, and suffers from spurious resonances. The EFIE has both a compact piece and a hypersingular piece (coming from the double gradient term). The spurious resonances of the MFIE may be eliminated by adding the EFIE to form a combined field integral equation (CFIE). The cost of doing so is the introduction of EFIE's hypersingular piece, which spoils the conditioning for fine discretizations (or low frequencies).

It is known that a hypersingular integral operator and a first-kind integral operator are ideal preconditioners for each other, in the sense that the composition of the two has the spectral characteristics of a second-kind integral operator. A similar approach may be employed to analytically precondition the EIFE. In fact, as disclosed herein, the electric field integral operator T preconditions itself.

Two issues are important for the successful application of this idea to closed bodies. First, only the local (or short distance) behavior of the preconditioner is important for asymptotic conditioning. Thus, the EFIE may be preconditioned by multiplying it by an electric field integral operator corresponding to an arbitrary wavenumber, real or complex; if the wavenumber has a positive imaginary part, the introduction of any additional resonances may be avoided. If the EFIE preconditioner reproduced the MFIE resonances, then the CFIE would also have them. Second, one must take care that the discretization of the product of the preconditioner and preconditioned operators preserves the correct spectral properties.

The present invention provides well-conditioned formulations for closed surfaces. Example numerical results are provided further below in order to demonstrate the advantages of the modified CFIE formulation over the conventional CFIE.

In the literature, integral operators have been constructed from the kernel for the Laplace and Helmholtz equations in 2d. Through the construction of these operators, it has been observed that the product of a first-kind operator, constructed from an undifferentiated kernel, and a hypersingular operator, constructed from a twice differentiated kernel, has the desirable spectral characteristics of a second-kind operator. Since the EFIE integral operator T has both of these, it may be seen that the composition of two such operators $T^2 \equiv T \circ T$ would include a constant operator and a compact operator. Also of concern is that the product of hypersingular components would produce another hypersingular operator. However, it is easy to see that the rotation operation n× in the definition of T, as shown in equation (3) above, annihilates the component of the surface vector field normal to the surface and ensures that the product of the two hypersingular operators is identically equal to zero. Indeed, applying the hypersingular component of the second T operator to an arbitrary tangential surface vector function f(x') produces a surface gradient function, $$n \times \nabla \phi(x) = \frac{i}{k}(n \times \nabla) \int_s ds' \nabla G(k; x, x') \cdot f(x'), \quad (5)$$

(note the dot-product operator,·) which the hypersingular component of the first T operator, in turn, annihilates (for closed surfaces) by virtue of the identity $$\nabla_S \cdot [n \times \nabla \phi(x)] = 0, \quad (6)$$

with $\nabla_S$ denoting the surface gradient operator on S; the identity shown in equation (6), the surface analog of the 3d identity $\nabla \cdot [\nabla \times \phi(x)] = 0$, can be found and is valid for any sufficiently smooth function φ on S. It follows immediately from equations (3), (5), and (6) that $T^2$ behaves as a second-kind integral operator.

In this specification, the spectral properties of the EFIE and MFIE integral operators and combinations thereof for the PEC sphere, a simple 3d target for which the spectral properties of these operators are known analytically, are discussed. However, this discussion may be expanded to incorporate other object shapes. The use of the PEC sphere herein is intended to provide a non-limiting example of an object to which the present invention may be applied. A complete set of basis functions on the surface of a sphere of radius a is given by the vector spherical harmonics, $$X_{lm}(\theta, \varphi) \equiv \frac{a}{i\sqrt{l(l+1)}} n \times \nabla Y_{lm}(\theta, \varphi) \text{ and} \quad (7)$$

$$U_{lm}(\theta, \phi) = n \times X_{lm}(\theta, \phi), \quad (8)$$

defined here in terms of the scalar spherical harmonics $Y_{lm}(\theta, \phi)$.

The result of applying T and $$K^+ \equiv \left(K + \frac{1}{2}\right)$$

to each basis function is:

$$T(k)\begin{Bmatrix} X_{lm} \\ U_{lm} \end{Bmatrix} = \begin{Bmatrix} -\mathbb{J}_l(ka)\mathbb{H}_l(ka)U_{lm} \\ \mathbb{J}'_l(ka)\mathbb{H}'_l(ka)X_{lm} \end{Bmatrix} \quad (9)$$

and $$K^+(k)\begin{Bmatrix} X_{lm} \\ U_{lm} \end{Bmatrix} = \begin{Bmatrix} i\mathbb{J}'_l(ka)\mathbb{H}_l(ka)X_{lm} \\ -i\mathbb{J}_l(ka)\mathbb{H}'_l(ka)U_{lm} \end{Bmatrix}, \quad (10)$$

where $\mathbb{J}$ and $\mathbb{H}$ are Riccati-Bessel and (first-kind) Riccati-Hankel functions of order l, and k is the wavenumber associated with the kernel of each integral operator. The Riccati-Bessel and Riccati-Hankel functions are defined in terms of spherical Bessel and Hankel functions $j_l(x)$ and $h_l^{(1)}(x)$ by $$\mathbb{J}(x) = x j_l(x) \text{ and} \quad (11)$$

$$\mathbb{H}(x) = x h_l^{(1)}(x) \quad (12)$$

Although chosen basis functions $X_{lm}$ and $U_{lm}$ are not eigenfunctions of the operator $T(k)$, they are eigenfunctions of $T^2(k) \equiv T(k) \circ T(k)$:

$$T^2(k)\begin{Bmatrix} X_{lm} \\ U_{lm} \end{Bmatrix} = -\mathbb{J}_l(ka)\mathbb{H}_l(ka)\mathbb{J}'_l(ka)\mathbb{H}'_l(ka)\begin{Bmatrix} X_{lm} \\ U_{lm} \end{Bmatrix}. \quad (13)$$

The operator $T^2(k)$ has a bounded spectrum, since, in the limit of large l, its eigenvalues accumulate at $-\frac{1}{4}$ (a result which follows from the asymptotic properties of $j_l$ and $h_l^{(1)}$). However, as is evident, from equations (10) and (13), the operator $T^2(k)$ also shares resonances (at the zeros of $\mathbb{J}$ (ka) for the $X_{lm}$ modes, and at the zeros of $\mathbb{J}$ (ka) and for the $U_{lm}$ modes) with the MFIE operator $K^+(k)$. This is also evident from the identity $$T^2(k) = \frac{1}{4} - K^2(k) = -K^-(k) \circ K^+(k), \quad (14)$$

where $$K^- \equiv \frac{1}{2} - K.$$

Therefore, although $T^2(k)$ is a second-kind integral operator, it is not a suitable component of a resonance-free combined field integral equation for closed bodies.

As previously mentioned, boundedness of the spectrum of the product of two EFIE operators (of the form shown by equation (3)) is assured if they have the same short-distance behavior, a condition that does not require the two operators to share the same wavenumber (propagation constant). If EFIE operators are chosen with different wavenumbers, $T(k_1)$ and $T(k_2)$, it is possible to simultaneously obtain a bounded product and avoid MFIE resonances.

The following analysis indicates that ik is a particularly good choice for the wavenumber in the preconditioning operator (assuming that the wavenumber k is real). The eigensystem for $T$ (ik)∘T(k) on a sphere is $$T(ik) \circ (Tk)\begin{Bmatrix} X_{lm} \\ U_{lm} \end{Bmatrix} = -\begin{Bmatrix} \mathbb{J}'_l(ika)\mathbb{H}'_l(ika)\mathbb{J}_l(ka)\mathbb{H}_l(ka)X_{lm} \\ \mathbb{J}_l(ika)\mathbb{H}_l(ika)\mathbb{J}'_l(ka)\mathbb{H}'_l(ka)U_{lm} \end{Bmatrix}. \quad (15)$$

It is straightforward to show (given the properties of $j_l$ and $h_l^{(1)}$) that the eigenvalues of T(ik)∘T(k) accumulate at $$\frac{i}{4} \text{ and } -\frac{i}{4}$$

for the $X_{lm}$ and $U_{lm}$ eigenmodes, respectively, and that T(ik)∘T(k) does not share any resonances with the MFIE operator $K^+(k)$.

Since T(ik)∘T(k) is a second-kind integral operator (in the sense described below) and does not share any resonances with $K^+(k)$, it is possible now to develop the well-conditioned CFIE operator. The simplest form of such an operator is $$T(ik) \circ T(k) + \alpha K^+(k), \quad (16)$$

where α is a constant to be chosen. In developing this modified CFIE operator, the EFIE portion has been modified before being added to the MFIE portion (which is already a second-kind integral operator). The same applies to the excitation side of the equation. The resulting CFIE may be written as $$-T(ik)(n \times E^{inc}) + \alpha Z n \times H^{inc} = [T(ik) \circ T(k) + \alpha K^+(k)]J. \quad (17)$$

The eigensystem for the CFIE operator in (16) is $$[T(ik) \circ T(k) + \alpha K^+(k)]\begin{Bmatrix} X_{lm} \\ U_{lm} \end{Bmatrix} = \quad (18)$$

$$-\begin{Bmatrix} [\mathbb{J}'_l(ika)\mathbb{H}'_l(ika)\mathbb{J}_l(ka) - ia\mathbb{J}'_l(ka)]\mathbb{H}_l(ka)X_{lm} \\ [\mathbb{J}_l(ika)\mathbb{H}_l(ika)\mathbb{J}'_l(ka) + ia\mathbb{J}_l(ka)]\mathbb{H}'_l(ka)U_{lm} \end{Bmatrix}.$$

If one chooses α=±1 then, as a function of the argument kα, these eigenvalues have no zeros. For α=+1, they circle the origin of the complex plane.

Other well-conditioned (modified) CFIE operators can be devised, for example, by preconditioning the MFIE part before combining it with the preconditioned EFIE part. Two example forms of alternative well-conditioned (modified) CFIE operators are as follows:

$$T(ik) \circ T(k) + \alpha K^+(ik) \circ K^+(k) \quad (19)$$

and $$T(ik) \circ T(k) + \alpha n \times K^+(ik) \circ n \times K^+(k). \quad (20)$$

It has been observed that the numerical behavior of the three modified CFIE operators (in (16), (19), and (20)) is similar.

By virtue of the analysis on spheres, the modified CFIE operators in (16), (19), and (20) have been shown to be second-kind and resonance-free. However, given that the asymptotic behavior of the eigenvalues on a smooth surface stems from the short distance behavior of the kernel, it may be seen that the asymptotic behavior of the various operators on spheres should also obtain for any closed surface that can be obtained by smooth deformation of a sphere. The numerical results presented further below support this argument. Results are also presented for a cube, which, like many targets of practical interest, has geometric singularities.

These suggest that the modified CFIE formulations should be well-conditioned for a wide class of closed surfaces.

Discretization and an Alternate Form of the Modified CFIE Formulation

Discretization of the modified (well-conditioned) CFIE formulation utilized in the present invention may take place by any appropriate method. Suitable methods are common in the literature, non-limiting examples of which include the Nyström discretization method and the method of moments. A particularly useful reference in regard to the Nyström discretization method, which may be used in conjunction with the present invention may be found in reference [13], in the Background, titled "Numerical solution of the Helmholtz equation in 2d and 3d using a high-order Nyström discretization" by Canino et al. Note also, incorporating the approach of the present invention into existing "fast" solvers is completely straightforward.

There are several ways to discretize the product operator $T(k_1) \circ T(k_2)$. The simplest and most straightforward approach, multiplying the discretized representations of the individual operators, can lead to numerical difficulties. The reason is that it is relatively difficult to make the discretized representations of the hypersingular part of each operator sufficiently accurate (especially for high-spatial-frequency eigenmodes) to numerically effect the cancellation that obtains analytically.

Effective discretizations of $T(k_1) \circ T(k_2)$ can be obtained either by discretizing the product operator directly or by reformulating the product operator to eliminate the product of hypersingular operators. The second approach has been implemented using a reformulated product operator that eliminates all instances of hypersingular operators. A short derivation of the reformulated equation is provided below.

The first step toward obtaining a more useful form of the product operator $T(k_1) \circ T(k_2)$ is to separate each integral operator into its singular and hypersingular components. Introducing the abbreviations, $$T_1 = T(k_1) \text{ and} \tag{21}$$

$$T_2 = T(k_2), \tag{22}$$

and substituting, the following can be written:

$$T_1 = ik_1 T_1^S + \frac{i}{k_1} T_1^H, \tag{23}$$

$$T_2 = ik_2 T_2^S + \frac{i}{k_2} T_2^H, \tag{24}$$

where, $$T_m^S J \equiv n(x) \times \int_S ds' G(k_m; x, x') J(x'), \text{ and} \tag{25}$$

$$T_m^H J \equiv (n(x) \times \nabla) \int_S ds' \nabla G(k_m; x, x') \cdot J(x'). \tag{26}$$

The product operator $T_1 \circ T_2$ can be expanded into four terms. Each of the two cross terms, $T_1^S \circ T_2^H$ and $T_1^H \circ T_2^S$, can be transformed (by Stokes's theorem) into a product of new, single-gradient integral operators on S plus a line integral around the boundary of S. The term formed by the product of the hypersingular integral operators, $T_1^H \circ T_2^H$, reduces to a line integral. The result is further simplified by noticing that two of the three line integrals, when applied to J, can be combined into a single term whose argument is identical to the incident electric field $E^{inc}$ by virtue of equation (1).

The next step is to reformulate the excitation side of the equation, taking advantage of the fact that the incident wave obeys Maxwell's equations. By applying Stokes's theorem, the term $T_1^H[n(x') \times E^{inc}(x')]$ may be rewritten as the sum of a single-gradient integral operator on $\nabla' \times E^{inc}(x')$ and a line integral that exactly cancels the line integral involving $E^{inc}$ on the other side of the equation. A further simplification follows from Faraday's Law, $\nabla \times E = i\omega\mu H$.

The final result for the analytically preconditioned EFIE with reformulated integral operator product is $$-ik_1 T_1^S(n \times E^i) - Z\frac{k_1}{k_2} T_1^\alpha(n \cdot H^i) = \tag{27}$$

$$\left(\frac{k_2}{k_1} T_1^\alpha \circ T_2^T + \frac{k_1}{k_2} T_1^\beta \circ T_2^L - k_1 k_2 T_1^S \circ T_2^S - \frac{k_1}{k_2} T_1^E \circ T_2^L\right) J$$

where the various integral operators are defined by:

$$T_m^\alpha \phi \equiv n(x) \times \int_S ds' \nabla G(k_m; x, x') \phi(x'), \tag{28}$$

$$T_m^\beta \phi \equiv n(x) \times \int_S ds' n(x') \times \nabla' G(k_m; x, x') \phi(x'), \tag{29}$$

$$T_m^L f \equiv \int_S ds' \nabla G(k_m; x, x') \cdot f(x'), \tag{30}$$

$$T_m^T f \equiv n(x) \cdot \int_S ds' \nabla G(k_m; x, x') \times f(x'), \tag{31}$$

$$T_m^S f \equiv n(x) \times \int_S ds' G(k_m; x, x') f(x'), \text{ and} \tag{32}$$

$$T_m^E \phi \equiv n(x) \times \int_{\partial S} dl' G(k_m; x, x') \phi(x'), \text{ and} \tag{33}$$

where m=1, 2. Note that $T_m^\alpha$, $T_m^\beta$, and $T_m^E$ map scalar functions to surface vector functions, whereas $T_m^L$ and $T_m^T$ do the reverse. The operator on the right hand side of equation (27) maps surface vector functions into surface vector functions. Now, closed surfaces will be discussed, and it may be observed that $T_1 \circ T_2$ behaves like a second-kind integral operator.

If S is a closed surface, the term $T_1^E \circ T_2^L J$ vanishes and equation (27) simplifies to $$-ik_1 T_1^S(n \times E^i) - Z\frac{k_1}{k_2} T_1^\alpha(n \cdot H^i) = S(k_1, k_2)J, \tag{34}$$

where $$S_{12} \equiv S(k_1, k_2) \equiv \frac{k_2}{k_1} T_1^\alpha \circ T_2^T + \frac{k_1}{k_2} T_1^\beta \circ T_2^L - k_1 k_2 T_1^S \circ T. \tag{35}$$

Now, several features of $S_{12}$ will be discussed.

First, all of the individual operators that comprise $S_{12}$ involve kernels with one or no gradients on the Helmholtz Green's function G. All such integral operators are bounded.

Second, the eigenvalues of the integral operator $S_{12}$ do not accumulate at the origin. This may be demonstrated by examining its three components, $T_1^\alpha \circ T_2^T$, $T_1^\beta \circ T_2^L$, and $T_1^S \circ T_2^S$. The operator $T_1^\alpha \circ T_2^T$ is a second-kind integral operator for the transverse (divergence-free) component of J, and is identically zero for the longitudinal (irrotational) component of J. Likewise, the operator $T_1^\beta \circ T_2^L$ is a second-kind operator for the longitudinal component of J, and is identically zero for the transverse component of J. Since any surface current distribution can be decomposed into longitudinal and transverse components, the sum $$\frac{k_2}{k_1}T_1^\alpha \circ T_2^T + \frac{k_1}{k_2}T_1^\beta \circ T_2^L$$

is a second-kind integral operator; subtracting $k_1k_2T_1^S \circ T_2^S$, a compact operator, does not change this result. As observed previously, resonance sharing may be avoided by setting $k_1=ik$ and $k_2=k$. In this case, the eigenvalues of $S_{12}$ accumulate at two points, $$\pm \frac{i}{4},$$

rather than only at $$-\frac{1}{4}.$$

Third, the spectrum of $S_{12}$, after discretization, is bounded and includes accumulation points at the expected locations. However, an accurate discretization will have zero (or very small) eigenvalues wherever the EFIE operator $T(k_2)$ has a resonance. Thus, it has to be combined with an appropriate discretization of the MFIE operator, to obtain an effective discretization of the CFIE.

Finally, it should be noted that equation (34) is manifestly insusceptible to the "low-frequency" problem that plagues the EFIE. Since the well-conditioned behavior of $S_{12}$ comes from the composite operators $$\frac{k_2}{k_1}T_1^\alpha \circ T_2^T \text{ and } \frac{k_1}{k_2}T_1^\beta \circ T_2^L,$$

both of whose prefactors have modulus unity (assuming $|k_1|=|k_2|=k$), and since the term $k_1k_2T_1^S \circ T_2^S$ tends to zero as $k \to 0$, the full operator $S_{12}$ remains well conditioned in the limit of low frequency.

In summary, although the operators $T_1 \circ T_2$ and $S_{12}$ have identical spectral properties for closed bodies, it is easier to construct an accurate discretization for $S_{12}$ because it is composed of less singular integral operators. Matrix representations of $S_{12}$ have bounded spectra, but also suffer from spurious resonances inherited from the EFIE operator $T(k_2)$. These resonances can be eliminated by combining $S_{12}$ with $K^+(k_2)$ (or the modified MFIE operators in equations (19) and (20)). The result is a well-conditioned system of linear algebraic equations.

An Alternate General Formulation of the Modified CFIE

The boundary integral equation used for the present invention may be formulated more generally, as follows:

(E excitation term)+γ(H excitation term)={(E integral operator term)+γ(H integral operation term)}J where, γ is a complex constant, J represents the unknown surface source distribution, and the (E excitation term) and (E integral operator term) are of a formulation selected from the group consisting of A and B, with A representing the combination of (E excitation term)≡$T(k_1)(-n(x) \times E^{inc}(x))$ and (E integral operator term)≡$T(k_1)T(k_2)$, and with B representing the combination of (E excitation term)≡

$$ik_1T^S(k_1)(-n(x) \times E^{inc}(x)) - \zeta\frac{k_2}{k_1}T^\alpha(k_1)(Zn(x) \cdot H^{inc}(x)) \text{ and}$$

(E integral operator term)≡

$$\zeta\frac{k_2}{k_1}T^\alpha(k_1) \circ T^T(k_2) + \frac{k_1}{k_2}T^\beta(k_2) \circ T^L(k_2) - k_1k_2T^S(k_1) \circ T^S(k_2); \text{ and where}$$

the (H excitation term) and (H integral operation term) are of a formulation selected from the group consisting of A', B', and C', with A' representing the combination of (H excitation term)≡$Zn(x) \times H^{inc}(x)$ and (H integral operation term)≡$K^+(k_2)$, B' representing the combination of (H excitation term)≡$K^+(k_1)(Zn(x) \times H^{inc}(x))$ and (H integral operation term)≡$K^+(k_1) \circ K^+(k_2)$; and C' representing the combination of (H excitation term)≡$n \times K^+(k_1)(Zn(x) \times H^{inc}(x))$ and (H integral operation term)≡$\lfloor n \times K^+(k_1) \rfloor \circ \lfloor n \times K^+(k_2) \rfloor$, wherein;

$$T(k) \equiv ikn(x) \times \int_S ds'\{G(k; x, x')J(x) +$$

$$\frac{1}{k^2}\nabla[\nabla G(k; x, x') \cdot J(x')]\},$$

$$K^+(k) \equiv \frac{1}{2} + K(k), \text{ and}$$

$$K(k) \equiv -n(x) \times \int_S ds' \nabla G(k; x, x') \times$$

$$J(x'), \text{ and}$$

wherein J≡Zn×H is the unknown surface current;

ζ is a complex number;

$E^{inc}$ and $H^{inc}$ are the incident electric and magnetic fields, respectively;

Z=$\sqrt{\mu/\epsilon}$ is the wave impedance;

G(k; x, x')=exp(ikr)/4πr is the 3d Helmholtz kernel, where r=|x−x'| is the distance separating field and source points with harmonic time dependence $e^{-i\omega t}$ assumed, and where $$T^\alpha(k)\phi \equiv n(x) \times \int_S ds' \nabla G(k; x, x')\phi(x'),$$

$$T^\beta(k)\phi \equiv n(x) \times \int_S ds' n(x') \times \nabla' G(k; x, x')\phi(x'),$$

$$T^L(k)f \equiv \int_S ds' \nabla G(k; x, x')f(x'),$$

-continued $$T^T(k)f \equiv n(x) \cdot \int_S ds' \nabla G(k; x, x') \times f(x'), \text{ and}$$

$$T^S(k)f \equiv n(x) \times \int_S ds' G(k; x, x') f(x'), \text{ and where}$$

∇ and ∇' denote differention with respect to the field point x and source point x', respectively, and n(x) and n(x') are outward-pointing unit vectors normal to the target surface S at x and x', respectively, and
$i \equiv \sqrt{-1}$;

$k_2$ is the propagation constant in the medium external to S;

$k_1$ is a complex number chosen to avoid resonances.

This general form may be modified to provide the preferred form of the modified CFIE, as previously mentioned, $$kT^S(ik)n\times E^{inc}+iZT^\alpha(ik)n\cdot H^{inc}=\{i[-T^\alpha(ik)\circ T^T(k)+T^\beta(ik)\circ T^L(k)-k^2T^S(ik)\circ T^S(k)]-K^+(k)\}J,$$

,where (ik) is substituted for (k) in the various parts of the equation as defined above.

Specifically, for example, the term $$T^\alpha(k)\phi \equiv n(x) \times \int_S ds' \nabla G(k; x, x')\phi(x') \text{ is simply changed to}$$

$$T^\alpha(ik)\phi \equiv n(x) \times \int_S ds' \nabla G(ik; x, x')\phi(x').$$

The same type of change is applied to all of the other terms.

Numerical Results Demonstrating the Advantages of the Modified CFIE Over the Conventional CFIE Below, the computational performance of the conventional CFIE (referred to below as CFIE1), $$-n\times(n\times E')+Zn\times H'=[n\times T(k)+K^+(k)]J \quad (36)$$

is compared with the preconditioned CFIE (referred to below as CFIE2)

$$kT^S(ik)n\times E'+iZT^\alpha(ik)n\cdot H'-Zn\times H'=\{i[-T^\alpha(ik)\circ T^T(k)+T^\beta(ik)\circ T^L(k)-k^2T^S(ik)\circ T^S(k)]-K^+(k)\}J \quad (37)$$

produced by combining equation (17) (with α=−1) and equation (34) (with $k_1$=ik and $k_2$=k). Individual operators in these equations were discretized using a high-order Nyström scheme. In all cases, the wave impedance Z was set to unity.

Three examples are provided below to demonstrate the operation of the present invention. The first example shows how the condition number of each operator, defined as the ratio of the largest to smallest singular values, depends on the fineness of discretization. Table 1, below, lists the condition number (CN) of the matrix representing each CFIE operator as the size of the sphere decreases. In all cases, the same discretization was used, created by placing a 6-point quadrature rule on each of the 80 nearly identical patches that cover the sphere, for a total of 960 unknowns. As the sphere radius decreases, the condition number for the CFIE2 integral operator stabilizes at about 2, whereas the condition number for the CFIE1 continues to grow in inverse proportion to the radius.

TABLE 1

Condition number of CFIE matrices for shrinking PEC spheres

| radius(λ) | CFIE1 | CFIE2 |
|---|---|---|
| 1 | 4.2 | 3.04 |
| 1/4 | 15 | 2.68 |
| 1/16 | 59 | 2.04 |
| 1/64 | 230 | 1.99 |
| 1/256 | 940 | 1.97 |
| 1/1024 | 3800 | 1.97 |
| 1/4096 | 15000 | 1.97 |

The second test compares iterative solver performance for the modified CFIE with that for the conventional CFIE. The target geometry consists of two PEC spheres, one with a radius of λ/2, the other set at a resonant radius, namely, the first zero of $J_1'$ (2πr/λ) or r≈0.43667457λ. The spheres are separated by a λ/100 gap. The patches near the gap were subdivided by a factor of 10 to adequately resolve the currents, which vary rapidly there. Table 2 compares the iteration counts and radar cross section (RCS) errors for several discretizations. The iterations columns list the maximum number of iterations a conjugate gradient squared (CGS) route required to reach a residual error of $10^{-3}$. A solution computed from a substantially more refined discretization provided an accuracy reference. The stated error is the root mean squared (RMS) value of the difference between the monostatic φφ RCS of the comparison solution and the reference solution at 181 angles. For identical discretizations, the two methods had about the same error. The data show a dramatic difference, however, in the iteration count behavior of the two methods in response to discretization refinements.

TABLE 2

Iteration count and solution error vs. discretization for two PEC spheres.

| | | CPIE1 | | CPIE2 | |
|---|---|---|---|---|---|
| unknowns | patches | iterations | error | iterations | error |
| 1496 | 748 | 60 | 0.46 | 9 | 0.40 |
| 4488 | 748 | 126 | 0.18 | 11 | 0.18 |
| 996 | 498 | 44 | 0.61 | 9 | 0.48 |
| 2988 | 498 | 103 | 0.23 | 12 | 0.16 |
| 5976 | 498 | 163 | 0.016 | 11 | 0.029 |

The third test also compared iterative solver performance for the two CFIE formulations. In this case, the target was a cube of size 1λ (where λ is the wavelength of the radiation). Numerical results are presented for five different discretizations, the first of which was derived from a mesh (i.e., a set of patches) obtained by dividing each face into four squares. The second mesh was constructed from the first by subdividing each square into four smaller squares. The third mesh was constructed from the second by subdividing edge-touching patches in half along a line parallel to the edge; patches adjacent to two edges (i.e., corner patches) were divided into quarters. Meshes for the fourth and fifth discretizations were constructed by recursively applying the procedure by which the third mesh was constructed from the second. This process, known as patch tapering, is useful for resolving the source singularities that arise in the vicinity of geometric singularities. It also puts stress on the conventional CFIE because points near the edges get close together. Table 3 lists the maximum and average number of iterations the CGS routine required to obtain solutions for 92 independent excitations to a residual error of $10^{-3}$.

The total number of unknowns is the result of using a 9-point quadrature rule on each square or rectangular patch. The iteration count for CFIE2 grows very slowly with increasing taper depth, whereas for CFIE1 it increases steadily as expected.

TABLE 3

Iteration count vs. taper depth for 1λ PEC cube.

| unknowns | taper depth | CPIE1 max | CPIE1 ave | CPIE2 max | CPIE2 ave |
|---|---|---|---|---|---|
| 432 | 0 | 12 | 6.5 | 10 | 4.3 |
| 1728 | 1 | 18 | 9.9 | 11 | 4.9 |
| 3888 | 2 | 26 | 14 | 11 | 4.9 |
| 6912 | 3 | 41 | 23 | 11 | 5.5 |
| 10800 | 4 | 58 | 36 | 13 | 5.7 |

Appendix—Second-Kind Integral Operators

The standard definition of a second-kind integral operator is an operator of the form $$\lambda I + K, \quad (38)$$

where $\lambda$ is a constant, I is the identity, and K is a compact operator. In scattering theory, one encounters operators of the form $$\lambda_1 P_1 + \lambda_2 P_2 + K, \quad (39)$$

where $\lambda_1$ and $\lambda_2$ are constants and $P_1$ and $P_2$ are orthogonal projection operators such that $$P_1 + P_2 = I. \quad (40)$$

Operators of the form shown in equation (39) possess most of the desirable properties of second-kind integral operators. Although somewhat non-standard, such expressions are referred to as second-kind operators throughout this description.

Glossary of Terms and Conventions

Composition Operator—The composition operator used herein, and represented by the symbol, $\circ$, describes the following operation. Given a first integral operator, $$A \equiv \int_S ds' K^A(x, x'),$$

and a second integral operator, $$B \equiv \int_S ds'' K^B(x', x''),$$

then the composed operator $$A \circ B \equiv \int_S ds' K^A(x, x') \int_S ds'' K^B(x', x'').$$

Equivalent surface sources—According to a well-known mathematical theorem (the "equivalence principle"), the fields outside a volume V can be completely specified by a distribution of equivalent sources on the boundary of the volume S. If S corresponds to the surface of a metal target (which approximates a perfect electrical conductor), the equivalent sources correspond to true, physical surface currents.

Means—Generally, for purposes of this invention, the term refers to a computer program or sub-program, or a portion of a computer program operative for performing the task that the means is for. The means is generally considered to be language and computer platform independent, and in the form of computer instructions (or code) that may be either in the form of software or hardware.

Object—This term object refers to primarily any arbitrarily shaped closed surface for which equivalent surface sources and the resultant electromagnetic scattering are to be determined. Objects of interest could include, as non-limiting examples, aircraft or parts thereof, automobiles, tanks, boats, missiles, and fixed structures. The equations set forth herein are developed for perfectly electrically conducting (PEC) materials or approximately perfectly conducting materials such as metals. However, extension to surface scattering with more general boundary conditions is considered routine and within the scope of the present invention. The extension to an interface between two or more dielectrics, for example, is straightforward, with the resulting operators having condition numbers slightly lower than the case described herein. Although primarily developed for closed surfaces, the approach can potentially be extended for the case of open, perfectly conducting surfaces.

What is claimed is:

1. A computer program product, used in a computer system having a processor, for modeling an electromagnetic response of an arbitrarily shaped three-dimensional object to an arbitrary time-harmonic incident field by means of a well-conditioned boundary integral equation (BIE), the computer program product comprising:
   a. a recording medium;
   b. means, recorded on the recording medium for producing a discretized representation of a well-conditioned BIE to provide a well-conditioned, finite-dimensional linear system whose solution approximates a distribution of equivalent surface sources on a model caused by the arbitrary time-harmonic incident field; and
   c. means, recorded on the recording medium, for solving the linear system to determine values of the equivalent surface sources; whereby solution of the well-conditioned finite-dimensional linear system provides improved computational efficiency and solution accuracy.

2. A computer program product as set forth in claim 1, wherein the computer program product further comprises means, recorded on the recording medium for modeling electromagnetic scattering from the three-dimensional object due to the time-harmonic incident field as determined from the equivalent surface sources.

3. A computer program product as set forth in claim 2, wherein the computer program product is tailored for determining the electromagnetic scattering from a time-harmonic incident field in the form of a radar wavefront and where the three-dimensional object represents a component of a vehicle.

4. A computer program product, as set forth in claim 1, wherein the BIE produced is in a form of:

(E excitation term)+γ(H excitation term)={(E integral operator term)+γ(H integral operation term)}J where, γ is a complex constant, J represents the unknown surface source distribution, and the (E excitation term) and (E integral operator term) are of a formulation selected from the group consisting of A and B, with A representing a combination of (E excitation term)=T(k$_1$)(–n(x)×E$^{inc}$(x)) and (E integral operator term)=T(k$_1$)T(k$_2$), and with B representing a combination of (E excitation term) ≡

$$ik_1 T^S(k_1)(-n(x) \times E^{inc}(x)) - \zeta \frac{k_2}{k_1} T^\alpha(k_1)(Zn(x) \cdot H^{inc}(x))$$

and (E integral operator term) ≡

$$\zeta \frac{k_2}{k_1} T^\alpha(k_1) \circ T^T(k_2) + \frac{k_1}{k_2} T^\beta(k_2) \circ T^L(k_2) - k_1 k_2 T^S(k_1) \circ T^S(k_2);$$

and
where the (H excitation term) and (H integral operation term) are of a formulation selected from the group consisting of A', B', and C', with A' representing a combination of (H excitation term)=Zn(x)×H$^{inc}$(x) and (H integral operation term)=K$^+$(k$_2$);

B' representing a combination of (H excitation term)=K$^+$(k$_1$)(Zn(x)×H$^{inc}$(x)) and (H integral operation term)=K$^+$(k$_1$)∘K$^+$(k$_2$); and C' representing a combination of (H excitation term)=n×K$^+$(k$_1$)(Zn(x)×H$^{inc}$(x)) and (H integral operation term)=⌊n×K$^+$(k$_1$)⌋∘⌊n×K$^+$(k$_2$)⌋, wherein;

$$T(k) \equiv ikn(x) \times \int_S ds' \{G(k; x, x')J(x) + \frac{1}{k^2} \nabla [\nabla G(k; x, x') \cdot J(x')]\},$$

$$K^+(k) \equiv \frac{1}{2} + K(k), \text{ and}$$

$$K(k) \equiv -n(x) \times \int_S ds' \nabla G(k; x, x') \times J(x'), \text{ and}$$

wherein J=Zn×H is the unknown surface current;
ζ is a complex number;
E$^{inc}$ and H$^{inc}$ are incident electric and magnetic fields, respectively;
Z=$\sqrt{\mu/\epsilon}$ is the wave impedance;
G(k; x, x')=exp(ikr)/4πr is a 3d Helmholtz kernel,
where r=|x–x'| is a distance separating field and source points with
harmonic time dependence e$^{-i\omega t}$ assumed, and where $$T^\alpha(k)\phi \equiv n(x) \times \int_S ds' \nabla G(k; x, x')\phi(x'),$$

$$T^\beta(k)\phi \equiv n(x) \times \int_S ds' n(x') \times \nabla' G(k; x, x')\phi(x'),$$

-continued $$T^L(k)f \equiv \int_S ds' \nabla G(k; x, x')f(x'),$$

$$T^T(k)f \equiv n(x) \cdot \int_S ds' \nabla G(k; x, x') \times f(x'), \text{ and}$$

$$T^S(k)f \equiv n(x) \times \int_S ds' G(k; x, x')f(x'), \text{ and where}$$

∇ and ∇' denote differentiation with respect to the field point x and source point x', respectively, and n(x) and n(x') are outward-pointing unit vectors normal to the target surface S at x and x', respectively, and i=$\sqrt{-1}$
k$_2$ is the propagation constant in a medium external to S;
k$_1$ is a complex number chosen to avoid resonances.

5. A computer program product as set forth in claim 4, wherein the computer program product further comprises means, recorded on the recording medium for modeling electromagnetic scattering from the three-dimensional object due to the time-harmonic incident field as determined from the equivalent surface sources.

6. A computer program product as set forth in claim 4, wherein the BIE produced is in a form of:

$$kT^S(ik)n \times E^{inc} + iZT^\alpha(ik)n \cdot H^{inc} = \{i[-T^\alpha(ik) \circ T^T(k) + T^\beta(ik) \circ T^L(k) - k^2 T^S(ik) \circ T^S(k)] - K^+(k)\}J$$

and wherein the terms of (ik) are developed by substituting (ik) for (k) in the terms of the formulation set forth in claim 4.

7. A computer program product as set forth in claim 6, wherein the computer program product further comprises means, recorded on the recording medium for modeling electromagnetic scattering from the three-dimensional object due to the time-harmonic incident field as determined from the equivalent surface sources.

8. An apparatus for modeling the electromagnetic response of an arbitrarily shaped three-dimensional object to an arbitrary time-harmonic incident field by means of a well-conditioned boundary integral equation (BIE), the apparatus comprising:
   a. a computer system having a processor, a memory connected with the processor, and an input/output device connected with the processor for receiving parameters representing an arbitrarily shaped three-dimensional object and an arbitrary time-harmonic incident field;
   b. means, operating in the processor and the memory of the computer for utilizing the parameters representing the arbitrarily shaped three-dimensional object and the arbitrary time-harmonic incident field for producing a discretized representation of a well-conditioned BIE to provide a well-conditioned finite dimensional linear system whose solution approximates a distribution of equivalent surface sources on a model caused by the time-harmonic incident field; and
   c. means, operating in the processor and the memory of the computer for solving the linear system to determine values of the equivalent surface sources; whereby solution of the well-conditioned finite dimensional linear system provides improved computational efficiency and solution accuracy.

9. An apparatus as set forth in claim 8, wherein the apparatus further comprises means, operating in the processor and the memory of the computer for modeling electromagnetic scattering from the three-dimensional object due to the time-harmonic incident field as determined from the equivalent surface sources.

10. An apparatus as set forth in claim 9, wherein the apparatus is tailored for determining the electromagnetic scattering from a time-harmonic incident field represented in the form of a radar wavefront and where the three-dimensional object represents a component of a vehicle.

11. An apparatus as set forth in claim 8, wherein the BIE produced is in a form of:

(E excitation term)+γ(H excitation term)={(E integral operator term)+γ(H integral operation term)}J where, γ is a complex constant, J represents an unknown surface source distribution, and the (E excitation term) and (E integral operator term) are of a formulation selected from the group consisting of A and B, with A representing a combination of (E excitation term)≡T(k$_1$)(−n(x)×E$^{inc}$(x)) and (E integral operator term)≡T(k$_1$) T(k$_2$), and with B representing a combination of (E excitation term) ≡

$$ik_1 T^S(k_1)(-n(x) \times E^{inc}(x)) - \zeta \frac{k_2}{k_1} T^\alpha(k_1)(Zn(x) \cdot H^{inc}(x))$$

and (E integral operator term) ≡

$$\zeta \frac{k_2}{k_1} T^\alpha(k_1) \circ T^T(k_2) + \frac{k_1}{k_2} T^\beta(k_2) \circ T^L(k_2) - k_1 k_2 T^S(k_1) \circ T^S(k_2);$$

and where the (H excitation term) and (H integral operation term) are of a formulation selected from the group consisting of A', B', and C', with A' representing a combination of (H excitation term)≡Zn(x)×H$^{inc}$(x) and (H integral operation term)≡K$^+$(k$_2$);

B' representing a combination of (H excitation term)≡K$^+$(k$_1$)(Zn(x)×H$^{inc}$(x)) and (H integral operation term)≡K$^+$(k$_1$)∘K$^+$(k$_2$); and C' representing a combination of (H excitation term)≡n×K$^+$(k$_1$)(Zn(x)×H$^{inc}$(x)) and (H integral operation term)≡⌊n×K$^+$(k$_1$)⌋∘⌊n×K$^+$(k$_2$)⌋, wherein;

$$T(k) \equiv ikn(x) \times \int_S ds' \left\{ G(k; x,x')J(x) + \frac{1}{k^2} \nabla [\nabla G(k; x,x') \cdot J(x')] \right\},$$

$$K^+(k) \equiv \frac{1}{2} + K(k), \text{ and}$$

-continued $$K(k) \equiv -n(x) \times \int_S ds' \nabla G(k; x, x') \times J(x'), \text{ and}$$

wherein J≡Zn×H is the unknown surface current;

ζ is a complex number;

E$^{inc}$ and H$^{inc}$ are incident electric and magnetic fields, respectively;

Z=$\sqrt{\mu/\epsilon}$ is a wave impedance;

G(k; x, x')=exp(ikr)/4πr is a 3d Helmholtz kernel, where r=|x−x'| is a distance separating field and source points with harmonic time dependence e$^{-i\omega t}$ assumed, and where $$T^\alpha(k)\phi \equiv n(x) \times \int_S ds' \nabla G(k; x, x')\phi(x'),$$

$$T^\beta(k)\phi \equiv n(x) \times \int_S ds' n(x') \times \nabla' G(k; x, x')\phi(x'),$$

$$T^L(k)f \equiv \int_S ds' \nabla G(k; x, x')f(x'),$$

$$T^T(k)f \equiv n(x) \cdot \int_S ds' \nabla G(k; x, x') \times f(x'), \text{ and}$$

$$T^S(k)f \equiv n(x) \times \int_S ds' G(k; x, x')f(x'), \text{ and where}$$

∇ and ∇' denote differentiation with respect to the field point x and source point x', respectively, and n(x) and n(x') are outward-pointing unit vectors normal to the target surface S at x and x', respectively, and i≡$\sqrt{-1}$;

k$_2$ is the propagation constant in a medium external to S;

k$_1$ is a complex number chosen to avoid resonances.

12. An apparatus as set forth in claim 11, wherein the apparatus further comprises means, operating in the processor and the memory of the computer for modeling electromagnetic scattering from the three-dimensional object due to the time-harmonic incident field as determined from the equivalent surface sources.

13. A computer program product as set forth in claim 11, wherein the BIE produced is in a form of:

kT$^S$(ik)n×E$^{inc}$+iZT$^\alpha$(ik)n·H$^{inc}$={i[−T$^\alpha$(ik)∘T$^T$(k)+T$^\beta$(ik)∘T$^L$(k)− k$^2$T$^S$(ik)∘T$^S$(k)]−K$^+$(k)}J and wherein the terms of (ik) are developed by substituting (ik) for (k) in the terms of a formulation set forth in claim 11.

14. An apparatus as set forth in claim 13, wherein the apparatus further comprises means, operating in the processor and the memory of the computer for modeling electromagnetic scattering from the three-dimensional object due to the time-harmonic incident field as determined from the equivalent surface sources.

15. A method for modeling an electromagnetic response of an arbitrarily shaped three-dimensional object to an arbitrary time-harmonic incident field by means of a well-conditioned boundary integral equation (BIE), the method operating on a computer system having a processor, a memory connected with the processor, and an input/output device connected with the processor for receiving parameters representing an arbitrarily shaped three-dimensional object and an arbitrary time-harmonic incident field, the method comprising the steps of:

a. utilizing the parameters representing the arbitrarily shaped three-dimensional object and the arbitrary time-harmonic incident field for producing a discretized representation of a well-conditioned BIE to provide a well-conditioned finite dimensional linear system whose solution approximates a distribution of equivalent surface sources on a model caused by the arbitrary time-harmonic incident field; and b. solving the linear system to determine values of the equivalent surface sources; whereby solution of the well-conditioned finite-dimensional linear system provides improved computational efficiency and solution accuracy.

16. A method as set forth in claim 15, wherein the method further comprises the step of modeling electromagnetic scattering from the three-dimensional object due to the time-harmonic incident field as determined from the equivalent surface sources.

17. A method as set forth in claim 16, wherein the time-harmonic incident field is a radar wavefront and wherein the three-dimensional object represents a component of a vehicle, in order to determine the scattering of radar waves from a vehicle component due to in incident radar wave.

18. A method as set forth in claim 15, wherein the BIE produced is in a form of:

$$(E \text{ excitation term}) + \gamma(H \text{ excitation term}) = \{(E \text{ integral operator term}) + \gamma(H \text{ integral operation term})\}J$$

where, $\gamma$ is a complex,

J represents an unknown surface source distribution, and the (E excitation term) and (E integral operator term) are of a formulation selected from the group consisting of A and B, with A representing a combination of (E excitation term)$\equiv T(k_1)(-n(x) \times E^{inc}(x))$ and (E integral operator term)$\equiv T(k_1)T(k_2)$, and with B representing a combination of $$(E \text{ excitation term}) \equiv$$

$$ik_1 T^S(k_1)(-n(x) \times E^{inc}(x)) - \zeta \frac{k_2}{k_1} T^\alpha(k_1)(Zn(x) \cdot H^{inc}(x))$$

and (E integral operator term) $\equiv$ $$\zeta \frac{k_2}{k_1} T^\alpha(k_1) \circ T^T(k_2) + \frac{k_1}{k_2} T^\beta(k_2) \circ T^L(k_2) - k_1 k_2 T^S(k_1) \circ T^S(k_2);$$

and where the (H excitation term) and (H integral operation term) are of a formulation selected from the group consisting of A', B', and C', with A' representing a combination of (H excitation term)$\equiv Zn(x) \times H^{inc}(x)$ and (H integral operation term)$\equiv K^+(k_2)$;

B' representing a combination of (H excitation term)$\equiv K^+(k_1)(Zn(x) \times H^{inc}(x))$ and (H integral operation term)$\equiv K^+(k_1) \circ K^+(k_2)$; and C' representing a combination of (H excitation term)$\equiv n \times K^+(k_1)(Zn(x) \times H^{inc}(x))$ and (H integral operation term)$\equiv \lfloor n \times K^+(k_1) \rfloor \circ \lfloor n \times K^+(k_2) \rfloor$, wherein;

$$T(k) \equiv ikn(x) \times \int_S ds' \left\{ G(k; x, x')J(x) + \frac{1}{k^2} \nabla [\nabla G(k; x, x') \cdot J(x')] \right\},$$

$$K^+(k) \equiv \frac{1}{2} + K(k), \text{ and}$$

$$K(k) \equiv -n(x) \times \int_S ds' \nabla G(k; x, x') \times J(x'), \text{ and}$$

wherein J$\equiv$Zn$\times$H is an unknown surface current;

$\zeta$ is a complex number;

$E^{inc}$ and $H^{inc}$ are incident electric and magnetic fields, respectively;

$Z=\sqrt{\mu/\epsilon}$ is a wave impedance;

G(k; x, x') =exp(ikr)/4$\pi$r is a 3d Helmholtz kernel, where r=|x–x'| is a distance separating field and source points with harmonic time dependence $e^{-i\omega t}$ assumed, and where $$T^\alpha(k)\phi \equiv n(x) \times \int_S ds' \nabla G(k; x, x') \phi(x'),$$

$$T^\beta(k)\phi \equiv n(x) \times \int_S ds' n(x') \times \nabla' G(k; x, x') \phi(x'),$$

$$T^L(k)f \equiv \int_S ds' \nabla G(k; x, x') f(x'),$$

$$T^T(k)f \equiv n(x) \cdot \int_S ds' \nabla G(k; x, x') \times f(x'), \text{ and}$$

$$T^S(k)f \equiv n(x) \times \int_S ds' G(k; x, x') f(x'), \text{ and where}$$

$\nabla$ and $\nabla'$ denote differentiation with respect to the field point x and source point x', respectively, and n(x) and n(x') are outward-pointing unit vectors normal to the target surface S at x and x', respectively, and i$\equiv\sqrt{-1}$;

$k_2$ is the propagation constant in a medium external to S;

$k_1$ is a complex number chosen to avoid resonances.

19. A method as set forth in claim 18, wherein the method further comprises the step of modeling electromagnetic scattering from the three-dimensional object due to the time-harmonic incident field as determined from the equivalent surface sources.

20. A method as set forth in claim 18, wherein the BIE produced is in the form of:

$$kT^S(ik)n \times E^{inc} + iZT^\alpha(ik)n \cdot H^{inc} = \{i[-T^\alpha(ik) \circ T^T(k) + T^\beta(ik) \circ T^L(k) - k^2 T^S(ik) \circ T^S(k)] - K^+(k)\}J$$

and wherein the terms of (ik) are developed by substituting (ik) for (k) in the terms of the formulation set forth in claim 18.

21. A method as set forth in claim 20, wherein the method further comprises the step of modeling electromagnetic scattering from the three-dimensional object due to the time-harmonic incident field as determined from the equivalent surface sources.

22. A method for determining equivalent sources comprising acts of:

provic a set of properties associated with an object;

providing a set of properties associated with an incident wavefront;

generating a well-conditioned boundary equation based on an interaction between the set of properties associated with the object and the set of properties associated with the incident wavefront;

determining the equivalent sources based on the well-conditioned boundary equation, whereby a solution to the well-conditioned boundary equation comprises the equivalent sources.

23. The method of claim 22 further comprising an act of:

modeling a scatter of energy associated with a surface of the object based on the solution, whereby the scatter of energy results from the incident wavefront interacting with the object.

24. The method of claim 22, wherein the well-conditioned boundary equation comprises a combination of a standard magnetic field integral equation and a pre-conditioned electric field integral equation.

25. The method of claim 22, wherein the well-conditioned boundary equation comprises a combination of a pre-conditioned magnetic field integral equation and a pre-conditioned electric filed integral equation.

* * * * *